United States Patent
Lai et al.

(10) Patent No.: US 7,471,126 B2
(45) Date of Patent: Dec. 30, 2008

(54) PHASE LOCKED LOOP UTILIZING FREQUENCY FOLDING

(75) Inventors: Jyh-Ting Lai, Hsinchu (TW); Chun-Nan Ke, Taichung (TW)

(73) Assignee: Faraday Technology Corp., Hsin-Chu (TW)

( * ) Notice: Subject to any disclaimer, the term of this patent is extended or adjusted under 35 U.S.C. 154(b) by 50 days.

(21) Appl. No.: 11/550,601

(22) Filed: Oct. 18, 2006

(65) Prior Publication Data

US 2008/0106310 A1    May 8, 2008

(51) Int. Cl.
*H03L 7/06* (2006.01)

(52) U.S. Cl. ............... 327/156; 327/147; 327/148; 327/157

(58) Field of Classification Search ............ 327/156, 327/144, 155
See application file for complete search history.

(56) References Cited

U.S. PATENT DOCUMENTS

| | | | | |
|---|---|---|---|---|
| 4,516,083 A * | 5/1985 | Turney | ............... | 331/1 A |
| 5,133,064 A * | 7/1992 | Hotta et al. | ............... | 713/375 |
| 5,461,345 A * | 10/1995 | Taki | ............... | 331/1 A |
| 6,052,034 A * | 4/2000 | Wang et al. | ............... | 331/2 |
| 6,483,886 B1 * | 11/2002 | Sung et al. | ............... | 375/376 |
| 6,597,753 B1 * | 7/2003 | Okayasu et al. | ............... | 375/373 |
| 6,914,489 B2 * | 7/2005 | Charlon | ............... | 331/16 |
| 7,129,800 B2 * | 10/2006 | Gauthier et al. | ............... | 331/175 |

* cited by examiner

*Primary Examiner*—Kenneth B Wells
*Assistant Examiner*—John W Poos
(74) *Attorney, Agent, or Firm*—Winston Hsu

(57) ABSTRACT

A phase locked loop (PLL), including a phase-frequency detector receiving two clock signals and outputting a phase detection signal corresponding to the phase difference between the two clock signals is provided. A controller receives the phase detection signal and generates a first control signal and a second control signal according to the phase detection signal, an oscillator receiving the first control signal and outputting a first output clock signal with a folded period corresponding to the first control signal and a loop divider receiving the second control signal and the first output clock signal dividing the frequency of the first output clock signal by an integer unfolding divisor corresponding to the second control signal and outputting a second output clock signal coupled to the phase-frequency detector. The PLL eliminates unlocked frequencies for all process imperfections, has decreased circuit area and provides a broad output bandwidth.

18 Claims, 6 Drawing Sheets

PHASE LOCKED LOOP UTILIZING FREQUENCY FOLDING

BACKGROUND OF THE INVENTION

1. Field of the Invention

The invention relates to a phase locked loop, and in particular to a phase locked loop utilizing frequency folding.

2. Description of the Related Art

FIG. 1 is a schematic diagram of a conventional digital phase locked loop (DPLL) 100. As shown, the conventional phase locked loop 100 comprises a phase-frequency detector (PFD) 110, a controller 120, a digitally controlled oscillator (DCO) 130 comprising a fine tune circuit (FTC) 132 and a coarse tune circuit (CTC) 134, and a loop divider 140. The PFD 110 receives and detects the phase and frequency difference between a reference clock signal $S_R$ and a feedback clock signal $S_F$, and generates a phase detection clock signal $S_{PD}$ based on whether the feedback clock signal $S_F$ is leading or lagging the reference clock signal $S_R$. The phase detection clock signal $S_{PD}$ comprises an up control signal $S_U$ and a down control signal $S_D$ respectively determining whether the DCO 130 needs to generate an output clock signal $S_O$ with a higher or lower frequency (i.e. lower or higher period). The PFD 110 then provides the phase detection clock signal $S_{PD}$ to the controller 120.

The controller 120 generates a control word $C_W$ comprising a first control word $C_{W1}$ and a second control word $C_{W2}$ according to the phase detection clock signal $S_{PD}$ and then provides the first and second control words $C_{W1}$ and $C_{W2}$ respectively to the FTC 132 and CTC 134 within the DCO 130 to control the period of the output clock signal $S_O$ generated by the DCO 130. The first and second control words $C_{W1}$ and $C_{W2}$ respectively determine a high-resolution part and a low-resolution part of the period of the output clock signal $S_O$. Typically, the first and second control words $C_{W1}$ and $C_{W2}$ respectively are thermal code and one-hot code, as is described in relation to FIG. 3.

FIG. 2 shows the period T of the output clock signal $S_O$ corresponding to the control word $C_W$, illustrating the relationship of the high and low resolution parts of the output clock signal $S_O$ respectively with the first and second control word $C_{W1}$ and $C_{W2}$ of the control word $C_W$. As shown, the period range $T_{WHOLE}$ of the output clock signal $S_O$ is separated into a plurality of partially overlapped sub-period ranges $T_1$, $T_2$ and so on to $T_M$ respectively corresponding to the second control word $C_{W2}=C_{W2}(1)$, $C_{W2}(2)$ and so on to $C_{W2}(M)$. Each of the sub-period ranges $T_1$ to $T_M$ is further separated into a plurality of sub-period ranges $T_{11}$-$T_{N1}$, $T_{12}$-$T_{N2}$, and so on to $T_{1M}$-$T_{NM}$. The sub-period ranges $T_{11}$, $T_{12}$, and so on to $T_{1M}$ all correspond to the first control word $C_{W1}=C_{W1}(1)$. Similarly, the sub-period ranges $T_{21}$, $T_{22}$, and so on to $T_{2M}$ all correspond to the first control word $C_{W1}=C_{W1}(2)$. The other sub-period ranges can also be analogized. The sub-period ranges $T_1$ to $T_M$ with larger intervals belong to the low resolution part of the output clock signal $S_O$, and the sub-period ranges $T_{11}$ to $T_{N1}$, $T_{12}$ to $T_{N2}$, and so on to $T_{1M}$ to $T_{NM}$ with smaller intervals belonging to the high resolution part of the output clock signal $S_O$.

When the FTC 132 and CTC 134 respectively receive the first and second control word $C_{W1}$ and $C_{W2}$, they cooperate to generate the output clock signal $S_O$ with a period having high and low resolution parts respectively corresponding to the first and control words $C_{W1}$ and $C_{W2}$, and then provides the output clock signal $S_O$ to the loop divider 140. Note that in the figure, the output clock signal $S_O$ generated by the CTC 134 and a fine-tune output clock signal $S_{FO}$ generated by the FTC 132 have the same frequency but different phases, thus, the fine-tune output clock signal $S_{FO}$ can replace the output clock signal $S_O$ to serve as an output of the DCO 130 to be provided to the loop divider 140.

The loop divider 140 divides the frequency of the output clock signal $S_O$ by a predetermined integer to generate the feedback clock signal $S_F$. As is well-known to those skilled in the art, the loop divider 140 can be removed such that the output clock signal $S_O$ is connected directly to the phase-frequency detector 110 to serve as the feedback clock signal $S_F$.

FIG. 3 is a schematic diagram of the DCO 130 in FIG. 1. As shown, the FTC 132 comprises delay buffers 31_1 to 31_N, and the CTC 134 comprises first delay buffers 32_1 to 32_M and second delay buffers 33_1 to 33_M. The delay buffers 31_1 to 31_N of the FTC 132 are respectively turned on or off according to one bit of the first control word $C_{W1}$ (an N-bit thermal code) to provide different driving power to the CTC 134. Similarly, the first delay buffers 32_1 to 32_M of the CTC 134 are respectively turned on or off according to one bit of the second control words $C_{W2}$ (a M-bit one-hot code) to provide different delay paths to fine-tune output clock signal $S_{FO}$ from the FTC 132. As a result the FTC 132 and CTC 134 cooperate to generate the output clock signal $S_O$ with a period having high and low resolution parts respectively corresponding to the first and second control words $C_{W1}$ and $C_{W2}$.

The conventional DPLL 100, however, has several disadvantages. First, the CTC 134 occupies a large area of a chip for providing a sufficiently long delay period and hence broad bandwidth of the output clock signal $S_O$. Second, the controller 120 has high hardware complexity and requires a large chip area to generate the second control code $C_{W2}$ in one-hot code form. Third, as shown in FIG. 4, the period T of the output clock signal $S_O$ corresponding to control word $C_W$ in an unwanted case results from fabrication process variation, where the two adjacent first sub-period ranges $T_2$ and $T_3$ are not overlapped, inducing a forbidden period range $T_F$ and hence jitter of the output clock signal $S_O$. To prevent this, a complicated design procedure and lengthy simulation are required to ensure that all of the first sub-period ranges $T_1$-$T_M$ are partially overlapped.

BRIEF SUMMARY OF THE INVENTION

The invention provides a PLL capable of eliminating unlocked frequency for all process imperfections, decreasing circuit area of the DCO and the controller, and enlarging the frequency range of the output clock signal.

The invention provides a phase locked loop, comprising a phase-frequency detector, a controller, an oscillator and a loop divider. The phase-frequency detector receives and detects a phase difference between a reference clock signal and a feedback clock signal, and outputs a phase detection signal corresponding to the phase difference. The controller receives the phase detection signal and generates a first control signal and a second control signal according to the phase detection signal. The oscillator receives the first control signal and outputs a first output clock signal with a period corresponding to the first control signal. The loop divider receives the second control signal and the first output clock signal, divides the frequency of the first output clock signal by an integer unfolding divisor corresponding to the second control signal and outputs a second output clock signal coupled to the phase-frequency detector.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 5:
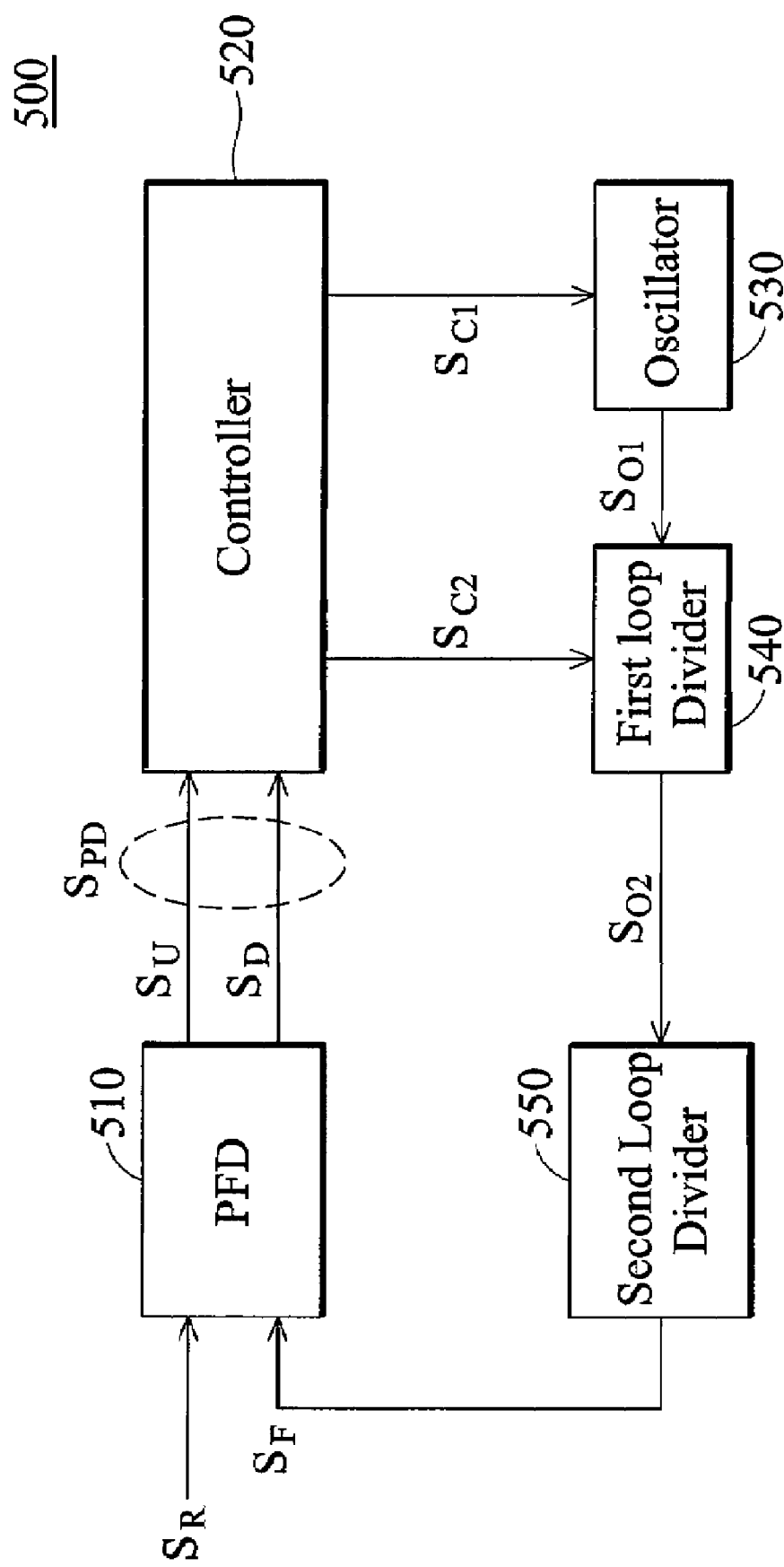
FIG. 5 is a block diagram of a phase locked loop in accordance with an embodiment of the invention.

FIG. 5 is a block diagram of a phase locked loop 500 in accordance with an embodiment of the invention. As shown, the phase locked loop 500 comprises a phase-frequency detector (PFD) 510, a controller 520, an oscillator 530, a first loop divider 540, and a second loop divider 550. The PFD 510 receives and detects a phase difference between a reference clock signal $S_R$ and a feedback clock signal $S_F$ and generates a phase detection clock signal $S_{PD}$ based on whether the feedback clock signal $S_F$ is leading or lagging the reference clock signal $S_R$. The phase detection clock signal $S_{PD}$ comprises an up control signal $S_U$ and a down control signal $S_D$ respectively determining whether the oscillator 530 and the first loop divider 540 need to generate a second output clock signal $S_{O2}$ with a higher or lower frequency (i.e. lower or higher period). The PFD 510 then provides the phase detection clock signal $S_{PD}$ to the controller 520.

The controller 520 generates a first control signal $S_{C1}$ and a second control signal $S_{C2}$ according to the phase detection clock signal $S_{PD}$ and then provides the first and second control signals $S_{C1}$ and $S_{C2}$ respectively to the oscillator 530 and the first loop divider 540 to respectively control the periods of first and second output clock signal $S_{O1}$ and $S_{O2}$ generated respectively by the oscillator 530 and the first loop divider 540. The first and second control signals $S_{C1}$ and $S_{C2}$ respectively determine the period of the first output clock signal $S_{O1}$ within a basic period range and an integer unfolding divisor (K) for dividing the frequency (i.e. for multiplying the period) of the first output clock signal $S_{O1}$ to construct the period of the second output clock signal $S_{O2}$. Since the first output clock signal $S_{O1}$ is generated by the oscillator 530, the basic period range where the period of the first output clock signal $S_{O1}$ (hereafter referred to as a "folded period") falls is the output period range of the oscillator 530.

After receiving the first control signal $S_{C1}$ from the controller 520, the oscillator 530 generates the first output clock signal $S_{O1}$ with a period corresponding to the first control signal $S_{C1}$ and provides the first output clock signal $S_{O1}$ to the first loop divider 540. The oscillator 530 can be a digitally controlled oscillator (DCO) or a voltage controlled oscillator (VCO). In an embodiment where the oscillator 530 is a DCO, the first control signal $S_{C1}$ is a digital signal such as a thermal code. In another embodiment where the oscillator 530 is a voltage control oscillator, the first control signal $S_{C1}$ is the voltage of an analog signal voltage. In the latter embodiment, the controller 520 may comprise a D/A converter for converting a digital signal corresponding to the period of the first output clock signal $S_{O1}$ to an analog signal with the voltage corresponding to the period of the first output clock signal $S_{O1}$.

After the first loop divider 540 receives the second control signal $S_{C2}$ from the controller 520 and the first output clock signal $S_{O1}$ from the oscillator 530, it divides the frequency of the first output clock signal $S_{O1}$ by the integer unfolding divisor (K) indicated by the second control signal $S_{C2}$ to generate the second output clock signal $S_{O2}$. The first loop divider 540 then provides the second output clock signal $S_{O2}$ to the second loop divider 550. The first divider 540 is typically implemented as a digital circuit, so the second control signal $S_{C2}$ can be a digital signal such as a one-hot code serving as the second control word $C_{W2}$ in the conventional DPLL 100, a binary code, and others. Preferably, the second control signal $S_{C2}$ is a binary code to decrease circuit complexity and area of the controller 520.

The second loop divider 550 then divides the frequency of the second output clock signal $S_{O2}$ by a predetermined integer N to generate the feedback clock signal $S_F$. As is well-known to those skilled in the art, the second loop divider 550 can be removed and the second output clock signal $S_{O2}$ can be connected to the phase-frequency detector 510 to serve as the feedback clock signal $S_F$.

Figure 1:
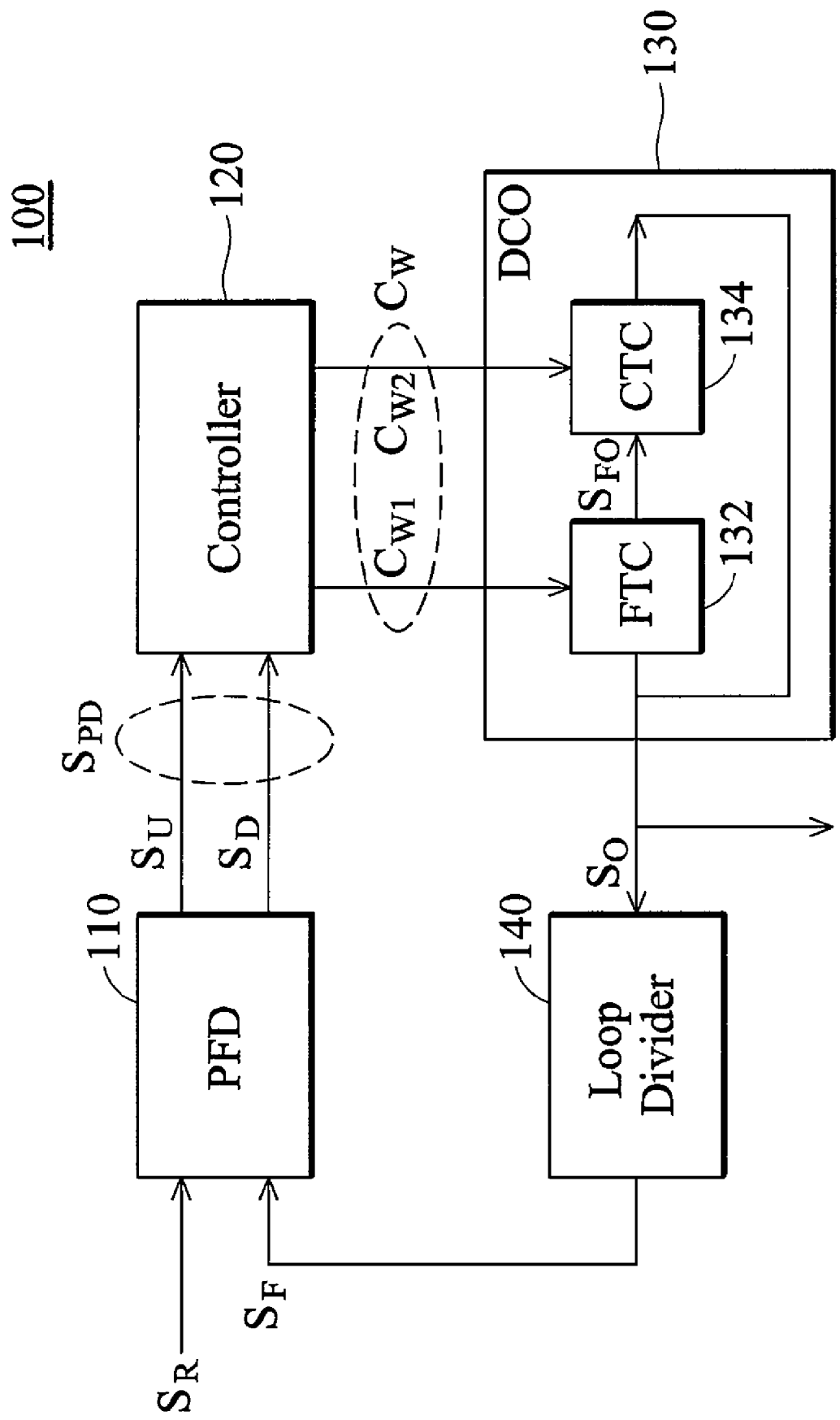
FIG. 1 is a schematic diagram of a conventional digital phase locked loop (DPLL)
Figure 2:
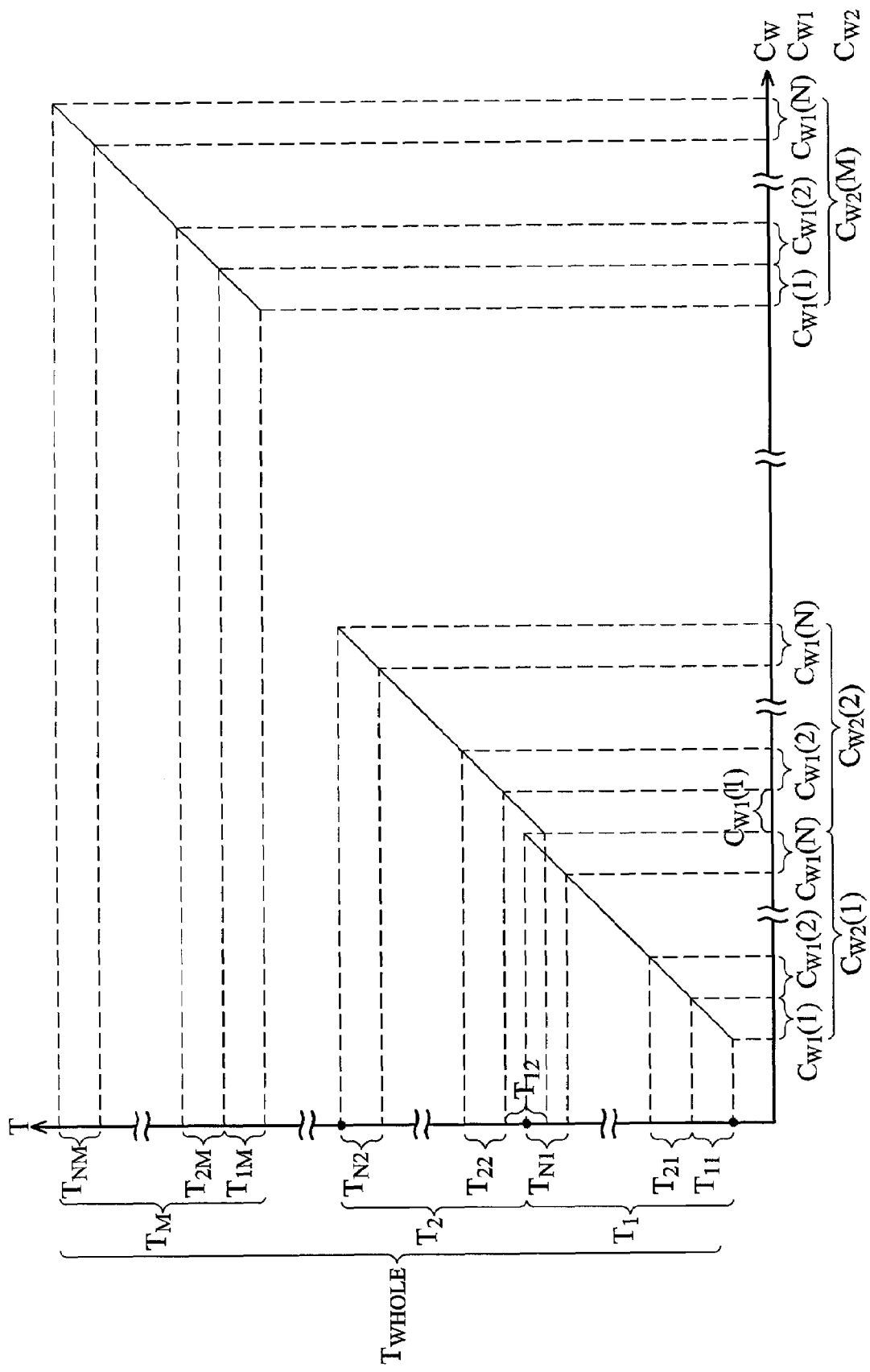
FIG. 2 shows the period of an output clock signal corresponding to a control word in FIG. 1.
Figure 3:
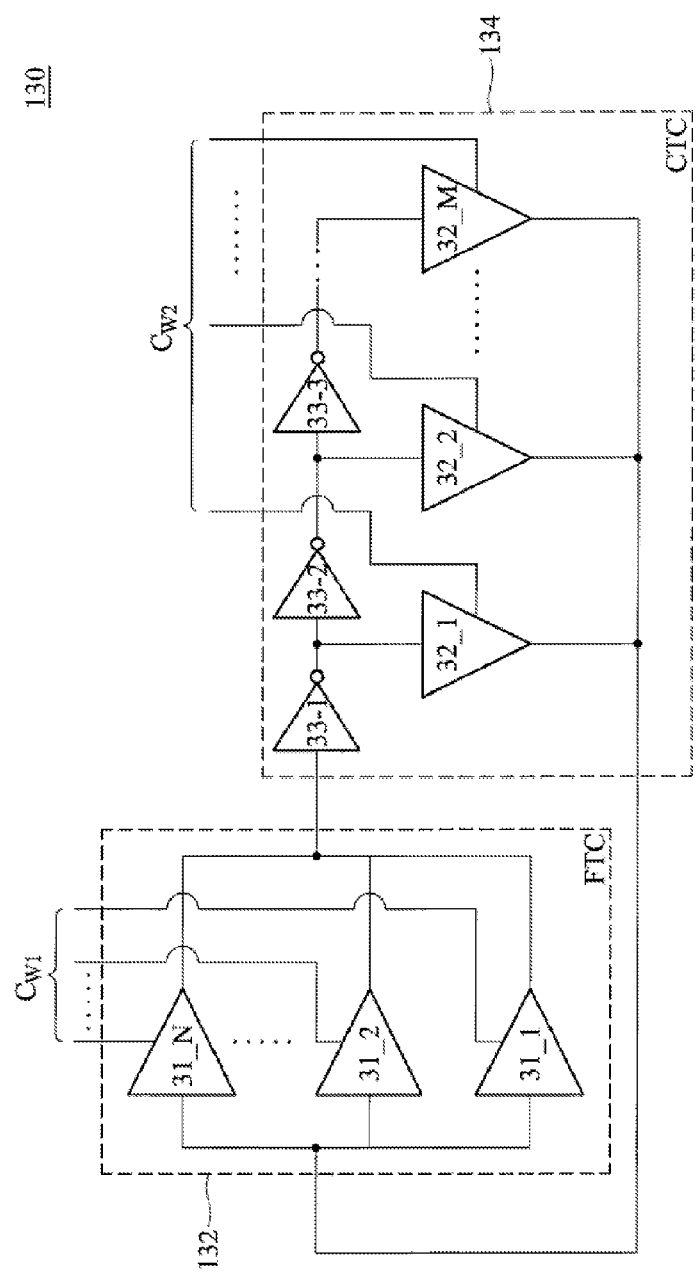
FIG. 3 is a schematic diagram of a DCO of FIG. 1.
Figure 4:
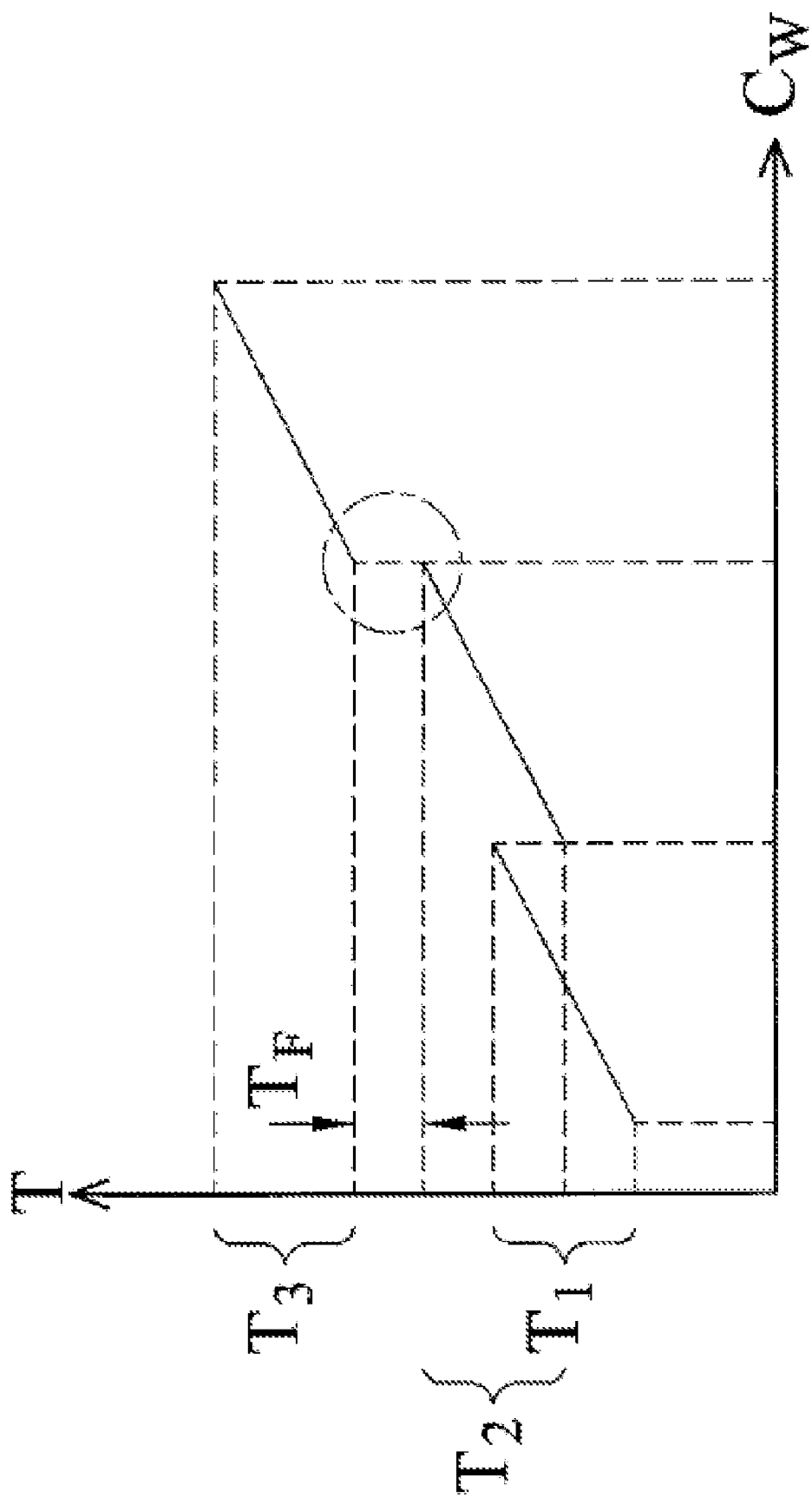
FIG. 4 shows the period of an output clock signal corresponding to a control word of FIG. 1 in an unwanted case.

With the cooperation of the oscillator 530 and the first loop divider 540, although the period of the first output clock signal $S_{O1}$ is limited within the basic period range, the period of the second output clock signal $S_{O2}$ is the integer unfolding divisor (K) multiplied by the period of the first output clock signal $S_{O1}$. In other words, the oscillator 530 has similar functions for generating periods with smaller intervals as the FTC 132 of FIG. 1 and can thus be realized using a plurality of shunted delay buffers as shown in FIG. 3. The first loop divider 540 performs similar functions to generate periods with larger intervals as the CTC 134 of FIG. 1. Compared with the CTC 134, the first loop divider 540 occupies a much smaller chip area and less circuit complexity.

Figure 6:
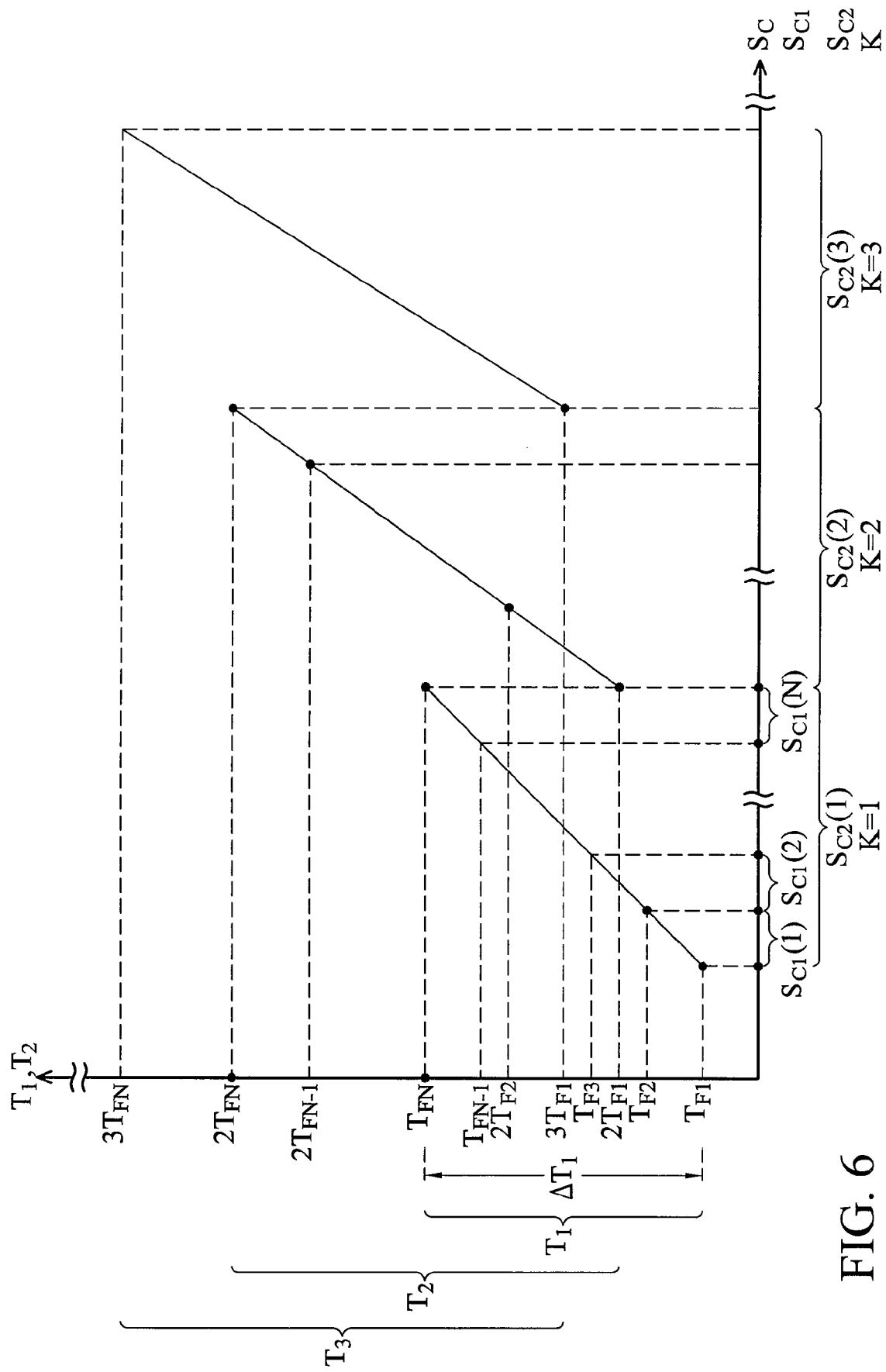
FIG. 6 shows the period of a first output clock signal corresponding to a first control signal and the period of a second output clock signal corresponding to a second control signal in FIG. 5.

FIG. 6 shows the period $T_1$ of the first output clock signal $S_{O1}$ corresponding to the first control signal $S_{C1}$ and the period $T_2$ of the second output clock signal $S_{O2}$ corresponding to the second control signal $S_{C2}$. As shown, the period range $T_1$ (i.e. the basic period range) of the first output clock signal $S_{O1}$ is separated into a plurality first sub-period ranges $T_{F1}$ to $T_{F2}$, $T_{F2}$ to $T_{F3}$, and so on to $T_{FN-1}$ to $T_{FN}$ respectively corresponding to the first control signal $S_{C1}=S_{C1}(1)$, $S_{C1}(2)$, and so on to $S_{C1}(N)$. The period range of the second output clock signal $S_{O2}$ is separated into a plurality of partially overlapped sub-period ranges $T_1$, $T_2$, $T_3$ and so on to $T_M$ (not shown) respectively corresponding to the second control signal $S_{C2}=S_{C2}(1)$, $S_{C2}(2)$, and so on to $S_{C2}(N)$, respectively further corresponding to the integer unfolding divisor K=1, 2, and so on.

Note that any of the two adjacent sub-period ranges $T_1$, $T_2$, $T_3$, and so on to $T_M$ must be partially overlapped to prevent unlocked event and hence jitter of the second clock signal $S_{O2}$. As shown in the figure, the overlapped range of two adjacent sub-period ranges $T_1$-$T_M$ increases with K. Accordingly, unlike each of the two adjacent sub-period ranges, overlapping of $T_1$-$T_M$ must be ensured in the design process of the conventional phase locked loop 100. Only first two sub-period ranges $T_1$ and $T_2$ require partial overlapping. As such, a preferable criteria for ensuring that any of the two adjacent periods are partially overlapped is:

$$\Delta T1 > T_{F1} \quad (1),$$

where ΔT1 equals the difference between the maximum period $T_{FN}$ and the minimum period $T_{F1}$ of the sub-period range $T_1$ (i.e. the basic period range). The design complexity is thus reduced by using the simple criteria. Additionally, since the overlapped range of two adjacent sub-period ranges increases with K, even if the criteria is not met due to process variation, the jitter probability of the second output clock signal $S_{O2}$ is still far less than that in the conventional phase locked loop 100.

A detailed description of the controller 520 generating the first and second control signals $S_{C1}$ and $S_{C2}$ is provided in the following. For convenience of explanation, the period of the first output clock signal $S_{O1}$ is referred to as the "folded period". When the controller 520 detects that the pulse width of the up control signal $S_U$ is longer than that of the down control signal $S_D$, indicating the feedback clock signal $S_F$ is leading the reference clock signal $S_R$, if the folded period falls below the maximum period of the basic period range, the controller 520 changes the first control signal $S_{C1}$ to increase the folded period; otherwise, the controller 520 switches the current sub-period range $T_m$ of the second output clock signal $S_{O2}$ to the next higher sub-period range $T_{m+1}$ by increasing the integer unfolding divisor and setting the folded period to the minimum period of the basic period range. Conversely, when the controller 520 detects that the pulse width of the up control signal $S_U$ is shorter than that of the down control signal $S_D$, indicating the feedback clock signal $S_F$ is lagging the reference clock signal $S_R$, if the folded period exceeds the minimum period of the basic period range, the controller 520 decreases the folded period; otherwise, the controller 520 switches the current sub-period range $T_m$ of the second output clock signal $S_{O2}$ to the next lower sub-period range $T_{m-1}$ by decreasing the integer unfolding divisor and setting the folded period to the maximum period of the basic period range.

An example is provided by referring FIG. 6 for better comprehension. In the example, the first control signal $S_{C1}$ is an 8-bit (N=8) thermal code $C_{T1}$-$C_{T8}$ (i.e. 00000001, 00000011, 00000111, ..., and 111111), respectively corresponding to first to eighth folded periods $T_{F1}$ to $T_{F8}$ from long to short of the second output clock signal $S_{O2}$, and the second control signal $S_{O2}$ is a 3-bit (M=3) binary code $C_{B1}$ to $C_{B8}$ (i.e. 000, 001, 010, 011, 100, 101, 110, and 111), respectively corresponding to the integer unfolding divisor K=1 to 8. When the controller 520 detects the phase detection signal $S_{PD}$ indicating the feedback clock signal $S_F$ is leading the reference clock signal $S_R$, the controller 520 changes the thermal code from $C_{Tn}$ to $C_{Tn-1}$ to increase the folded period from $T_{Fn}$ to $T_{F(n-1)}$ and maintains the current integer unfolding divisor K if the current n is between 2 and 8; Otherwise (n=1), the controller 520 not only changes the binary code from $C_{Bn}$ to $C_{Bn+1}$ to increase K from n to (n+1) but also changes the thermal code from $C_{Tn}$ to $C_{T8}$ to set the folded period from $T_{Fn}$ to $T_{F8}$. Conversely, when the controller 520 detects the phase detection signal $S_{PD}$ indicating the feedback clock signal $S_F$ is lagging the reference clock signal $S_R$, the controller 520 changes the thermal code from $C_{Tn}$ to $C_{Tn+1}$ to decrease the folded period from $T_{Fn}$ to $T_{F(n+1)}$ and maintains the current integer unfolding divisor K if the current n is between 1 and 7; Otherwise (n=8), the controller 520 not only changes the binary code from $C_{Bn}$ to $C_{Bn-1}$ to decrease K from n to (n-1) but also changes the thermal code from $C_{Tn}$ to $C_{T1}$ to set the folded period from $T_{Fn}$ to $T_{F1}$.

The PLL 500 of the invention utilizes the frequency-folding concept to generate a broad frequency range of the second output clock signal $S_{O2}$. More specifically, referring to FIGS. 5 and 6, the period range of the second output clock signal $S_{O2}$ is first folded into the sub-period $T_1$ (the basic period range) to be generated by the oscillator 530, and is then unfolded by the first loop divider 540. By ensuring that criteria (1) is satisfied, unlocked frequency for all process imperfections can be eliminated and the design procedure is simplified. Additionally, since there is no CTC disposed within the oscillator 530, and the second control signal $S_{C2}$ controlling the first loop divider 540 can be in binary-code form, the circuit area of the oscillator 530 and the controller 520 can be decreased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase locked loop, comprising:
   a phase-frequency detector, receiving and detecting a phase difference between a reference clock signal and a feedback clock signal, and outputting a phase detection signal corresponding to the phase difference;
   a controller, receiving the phase detection signal, determining a folded period and an integer unfolding divisor according the phase detection signal and a basic period range, and outputting a first control signal corresponding to the folded period and a second control signal corresponding to the integer unfolding divisor, wherein the basic period range comprises a plurality of sub-periods, and the folded period is one of the sub-periods;
   an oscillator, receiving the first control signal and outputting a first output clock signal with a period equal to the folded period; and
   a first loop divider, receiving the second control signal and the first output clock signal, dividing the frequency of the first output clock signal by the integer unfolding divisor corresponding to the second control signal and outputting a second output clock signal, wherein the feedback clock signal is provided according to the second output clock signal.

2. The phase locked loop of claim 1, wherein when the controller detects the phase detection signal indicating the feedback clock signal is lagging the reference clock signal, if the folded period falls beyond a minimum period of the basic period range, the controller decreases the folded period; otherwise, the controller decreases the integer unfolding divisor and sets the folded period to a maximum period of the basic period range.

3. The phase locked loop of claim 1, wherein when the controller detects the phase detection signal indicating the feedback clock signal is leading the reference clock signal, if the folded period falls below a maximum period of the basic period range, the controller increases the folded period; otherwise, the controller increases the integer unfolding divisor and sets the folded period to a minimum period of the basic period range.

4. The phase locked loop of claim 1, wherein the period of the second output clock signal falls within one of a plurality of sub-period ranges respectively corresponding to different values of the integer unfolding divisor.

5. The phase locked loop of claim 1, wherein any two adjacent sub-period ranges are partially overlapped.

6. The phase locked loop of claim 1, wherein the difference of the maximum and minimum periods of the sub-period range corresponding to the integer unfolding divisor equal to 1 is greater than the minimum period of the same.

7. The phase locked loop of claim 1, wherein the second control signal is a binary code.

8. The phase locked loop of claim 1, wherein the first control signal is an analog signal and the oscillator is a voltage controlled oscillator.

9. The phase locked loop of claim 1, wherein the first control signal is a digital signal and the oscillator is a digitally control oscillator.

10. The phase locked loop of claim 1, further comprising a second loop divider coupled between the first loop divider and the phase-frequency detector and providing the feedback clock signal according to the second output clock signal.

11. A frequency generation method, comprising:
   detecting phase difference between a reference clock signal and a feedback clock signal to generate a phase detection signal corresponding to the phase difference;
   determining a folded period and an integer unfolding divisor according the phase detection signal and a basic period range to provide a first control signal corresponding to the folded period and a second control signal corresponding to the integer unfolding divisor, wherein the basic period range comprises a plurality of sub-periods, and the folded period is one of the sub-periods;
   generating a first output clock signal with a period equal to the folded period according to the first control signal;
   dividing the frequency of the first output clock signal by the integer unfolding divisor according to the second control signal to generate a second output clock signal; and
   providing the feedback clock signal according to the second output clock signal.

12. The method of claim 11, wherein determination of the folded period and the integer unfolding divisor according the phase detection signal comprises when the phase detection signal indicates the feedback clock signal is lagging the reference clock signal, if the folded period falls beyond a minimum period of the basic period range, decreasing the folded period; otherwise, decreasing the integer unfolding divisor and setting the folded period to a maximum period of the basic period range.

13. The method of claim 11, wherein determination of the folded period and the integer unfolding divisor according the phase detection signal comprises when the phase detection signal indicates the feedback clock signal is leading the reference clock signal, if the folded period falls below a maximum period of the basic period range, increasing the folded period; otherwise, increasing the integer unfolding divisor and setting the folded period to a minimum period of the basic period range.

14. The method of claim 11, wherein the period of the second output clock signal falls within one of a plurality of sub-period ranges respectively corresponding to different values of the integer unfolding divisor.

15. The method of claim 11, wherein any two adjacent sub-period ranges are partially overlapped.

16. The method of claim 11, wherein the difference of the maximum and minimum periods of the sub-period range corresponding to the integer unfolding divisor equal to 1 is greater than the minimum period of the same.

17. The method of claim 11, wherein the second control signal is a binary code.

18. The method of claim 11, wherein provision of the feedback clock signal according to the second output clock signal comprises dividing the second output clock signal to provide the feedback clock signal.

* * * * *